United States Patent
Martens et al.

(10) Patent No.: US 8,306,134 B2
(45) Date of Patent: Nov. 6, 2012

(54) VARIABLE GAIN CONTROL FOR HIGH SPEED RECEIVERS

(75) Inventors: Jon S. Martens, San Jose, CA (US); Helen Chau, San Jose, CA (US); David A. Rangel-Guzman, San Jose, CA (US); Peter A. Kapetanic, Morgan Hill, CA (US); Dan Levassuer, Milpitas, CA (US)

(73) Assignee: Anritsu Company, Morgan Hill, CA (US)

( * ) Notice: Subject to any disclaimer, the term of this patent is extended or adjusted under 35 U.S.C. 154(b) by 654 days.

(21) Appl. No.: 12/505,413

(22) Filed: Jul. 17, 2009

(65) Prior Publication Data

US 2011/0013733 A1    Jan. 20, 2011

(51) Int. Cl.
  *H04K 1/10* (2006.01)
  *G10L 19/14* (2006.01)
  *G10L 11/06* (2006.01)
(52) U.S. Cl. ............ 375/260; 704/205; 704/208
(58) Field of Classification Search .......... 375/260; 704/205, 208
See application file for complete search history.

(56) References Cited

U.S. PATENT DOCUMENTS

| 3,636,463 | A |   | 1/1972 | Ongkiehong |
| 3,699,325 | A |   | 10/1972 | Montgomery, Jr. et al. |
| 5,233,190 | A | * | 8/1993 | Schlereth et al. ............. 250/291 |
| 5,243,349 | A | * | 9/1993 | Mims ......................... 342/25 A |
| 5,861,831 | A |   | 1/1999 | Murden et al. |
| 6,233,550 | B1 | * | 5/2001 | Gersho et al. ................ 704/208 |
| 2004/0253184 | A1 | * | 12/2004 | Li et al. ....................... 424/9.363 |
| 2005/0091041 | A1 | * | 4/2005 | Ramo et al. ................... 704/205 |
| 2005/0137858 | A1 | * | 6/2005 | Heikkinen et al. ........... 704/205 |
| 2010/0189188 | A1 | * | 7/2010 | Li et al. ........................ 375/260 |

* cited by examiner

*Primary Examiner* — David C. Payne
*Assistant Examiner* — Sarah Hassan
(74) *Attorney, Agent, or Firm* — Fliesler Meyer LLP

(57) ABSTRACT

A high speed receiver is provided using two parallel processing paths to enable rapid variable gain control. The parallel processing paths include a first processing path using a high resolution Discrete Fourier Transform (DFT), and a second processing path using a reduced DFT requiring fewer samples than the high resolution DFT. An initial sample of the data is processed using the second processing path with the reduced DFT by comparing a Fourier transform of the initial sample with predetermined threshold values. As a result of the comparison of the Fourier transform of the initial sample with the predetermined threshold values, a gain determination block determines whether a requirement exists for gain ranging. If gain ranging is needed, the gain of the data signal is adjusted and the gain ranging process repeats.

13 Claims, 5 Drawing Sheets

VARIABLE GAIN CONTROL FOR HIGH SPEED RECEIVERS

FIELD OF THE INVENTION

The present invention relates to systems and methods for variable gain control for high speed receivers.

BACKGROUND OF THE INVENTION

Many high speed receivers require variable intermediate frequency (IF) and/or radio frequency (RF) gain control in order to optimize dynamic range or other performance parameters. The dynamic range of a radio receiver is the range of input RF signal levels over which the receiver can operate. The low end of the range is governed by the receiver's noise sensitivity while the high end of the dynamic range of the receiver is governed by the receiver's overload or strong signal handling performance. In the particular case of high speed receivers, it is important that the gain decisions be made quickly and accurately so that the overall data acquisition time is not adversely impacted.

Typical gain ranging methods employ either a separate analog measurement to determine required gain (e.g., such as a Received Signal Strength Indication (RSSI) or other scalar power detection scheme) or take a measurement using a high resolution data acquisition path, adjust the gain, and repeat until an acceptable signal is received. The former often does not necessarily have enough accuracy or range to properly select the gain and the latter can take too much time since a full measurement cycle must be repeated when a gain change is made.

FIG. 1 is an example of a typical receiver 100 with variable gain stages. The receiver 100 includes gain stages 102 and 104, each having a variable gain amplifier. Although FIG. 1 illustrates two gain stages, there can be several IF variable gain stages and several RF variable gain stages. In addition, there can be multiple downconversions, each with its own IF stage and each of those IF stages can have multiple variable gain stages. One common configuration uses several IF variable gain stages and no variable gain RF stages. In FIG. 1, the gain stages 102 and 104 adjust the gain of a RF input signal 105 and an IF signal 108 based on a desired signal to be provided to the input of an analog-to-digital (A/D) converter 110.

The downconverter 106 can include a local oscillator that converts the RF input signal 104 into an IF signal 108. The gain of the IF signal 108 can be adjusted by the gain stage 104 prior to receipt of the IF signal at the A/D converter 110. If the variable gain of amplifier 104 is set too low, then the receiver will have sub-optimal dynamic range and signal-to-noise ratios can be a problem. If the variable gain is set too high, there can be compression of the amplifiers or distortion of the A/D converter and signal. In both cases, the dynamic range of the receiver would be compromised.

The digital signal output of the A/D converter 110 is received by a digital signal processor (DSP), field programmable gate array (FPGA), or some other digital processing device as represented by processing block 114. Several techniques can be employed by the processing block 114 that have been employed in the past to decide whether to change the gain (termed 'gain ranging'). In U.S. Pat. No. 3,636,463, entitled "Method of and Means for Gain-Ranging Amplification" (Ongkiehong), filed Dec. 12, 1969, the individual variable gain amplifiers are probed to determine when one amplifier is compressing and the preceding gain is reduced when this happens. In U.S. Pat. No. 5,861,831, entitled "Intermediate Frequency (IF) Sampling Clock-to-Clock Auto-Ranging Analog-to-Digital Converter (ADC) and Method" (Murden), filed Dec. 23, 1996, a peak detector is used prior to the A/D converter to determine what the amplitude of the signal is. By comparing this value to a list of predetermined gain-change values, it is known where to change the gain. In U.S. Pat. No. 3,699,325, entitled "Time-Shared Instantaneous Gain-Ranging Amplifier" (Montgomery), filed Oct. 9, 1969, a series of threshold detectors are used to accomplish the same task.

The above examples, however, typically use some analog hardware in conjunction with processing to determine the state of the signal and, hence, the required gain. In some cases, using primarily analog hardware to determine or measure the state of the IF signal to enable performing the gain ranging is not desired since the thresholds of the analog components used to check and reset gain levels may not be stable over time and temperature, or the decision process may be too slow for a high speed receiver. In addition, there may be synchronization issues between the analog circuits and the digital data acquisition process that require additional complexity to resolve. Such synchronization issues can also slow down the overall measurement process when a gain change is required. There may also be further complications if the incoming signal is spectrally complex in that the decision to change gain may be based on some attribute (e.g., total power) rather than the desired attribute (e.g., power at a specific frequency).

FIG. 2 illustrates an alternative to the analog hardware technique to determine whether gain ranging is required. In FIG. 2, the decision on whether to change the gain is based on the outcome of a Discrete Fourier Transform (DFT) that is determined primarily in the digital processor 114 of FIG. 1, rather than relying significantly on analog circuitry. There are typically stages of data reduction that can be performed in such a processor including, e.g., power measurements, peak value measurements and Fourier transforms, where the digital signal can be looked at to determine whether the gain needs adjusting. The configuration illustrated in FIG. 2 relies on a high resolution DFT as well as filtering performed in block 204. Once the DFT is performed, a decision can be made on whether gain ranging needs to occur. In gain determination block 206, a value of the DFT at a particular frequency is compared against a list of threshold values to determine if the gain needs to be adjusted. The list of threshold values can be in the form of a look up table. If the gain is to be changed, a control signal is provided from the processor back to the variable gain amplifier 102.

A disadvantage of the scenario of FIG. 2 is that in some cases the entire measurement cycle must be completed before it is known whether the gain has to be adjusted. In other words, if the gain does need to be adjusted, then the whole cycle must be repeated and the comparison performed again. Time delays during the gain ranging decision process itself may be important since the decision/gain change/settling process is serial in nature. These time penalties may be particularly troubling in a high speed receiver.

SUMMARY OF THE INVENTION

Embodiments of the present invention provide methods and systems to overcome the problems with making gain ranging decisions in previous high speed receiver environments.

The specific embodiments described herein relate to methods and systems that include receiving a digital data signal that is downconverted from a Radio Frequency (RF) input signal to an intermediate frequency (IF) signal and later converted to a digital data signal within a high speed receiver. The digital data signal is sampled in parallel, both in a first processing path using a high resolution Discrete Fourier Transform (DFT), and in a second processing path using a reduced DFT with a lower sampling count than the high resolution DFT. Use of the lower sample count path to make gain ranging decisions, then allows the system to both operate to change gain faster and to minimize the time required for any repeat measurements. The terms DFT and Fourier transform will be used throughout, but can be substituted with another time-frequency transform algorithm that converts time data to the frequency domain with adjustable precision/resolution. One alternative time-frequency transform to the DFT is a chirp-Z transform. High resolution in terms of the time-frequency transform of the DFT process refers to the higher number of samples used to compute the transform.

In the gain ranging process, an initial sample of the data is processed using the second processing path by applying the reduced DFT. The frequency-domain representation (for example, the Fourier transform) of the initial sample from the reduced DFT path is then compared with predetermined threshold values. The Fourier transform applied to the initial sample provides one or more spectral components that can be compared in a look-up table with threshold values to determine if gain adjustments should be applied. The reduced DFT can have a sample size set such that a minimum number of samples will resolve the spectral component within a predetermined uncertainty. In other words, the numerical precision of the reduced DFT can be set to a predetermined minimal value that provides the desired gain ranging resolution while limiting overall processing time. A determination is next made based on the threshold comparison whether a requirement exists for gain ranging.

Since the lower sample-count path can be processed before the high resolution DFT path has completed its analysis process, the gain can be adjusted when the determining step indicates that gain ranging is needed without requiring the high resolution DFT path to have completed. The step of changing the gain of the signal in the second processing path can further include providing a partial reset signal to the components providing both the low and high resolution DFTs. The partial reset signal enables determination of the DFTs with a proper gain setting as well as resetting buffers that store samples of the digital data, particularly before the high resolution DFT performs analysis on the newly sampled data so that new data with gain properly set can be buffered and used.

In apparatus embodiments of the invention, a receiver circuit for making gain ranging decisions includes a variable gain amplifier that receives the IF output from a downconversion in the receiver. The receiver further includes an A/D convertor that receives the output of the variable gain amplifier and provides a digital data signal to a processing device. The processing device can be, e.g., at least one of a Digital Signal Processor (DSP), a Field Programmable Gate Array (FPGA), and a Microprocessor. The processor samples the digital data signal in parallel, both in a first processing path, using a high resolution DFT, and in a second processing path, using a reduced DFT that requires fewer samples than the high resolution DFT. The processor processes an initial sample of the data using the second processing path with the reduced DFT by comparing a Fourier transform of the initial sample with predetermined threshold values. The processor then determines, as a result of the comparison of the Fourier transform of the initial sample with the predetermined threshold values, whether a requirement exists for gain ranging on the signal, and provides a signal to the variable gain control input of the variable gain amplifier to change the gain of the data signal when the processing device indicates gain ranging is needed.

DETAILED DESCRIPTION OF THE INVENTION

Figure 1:
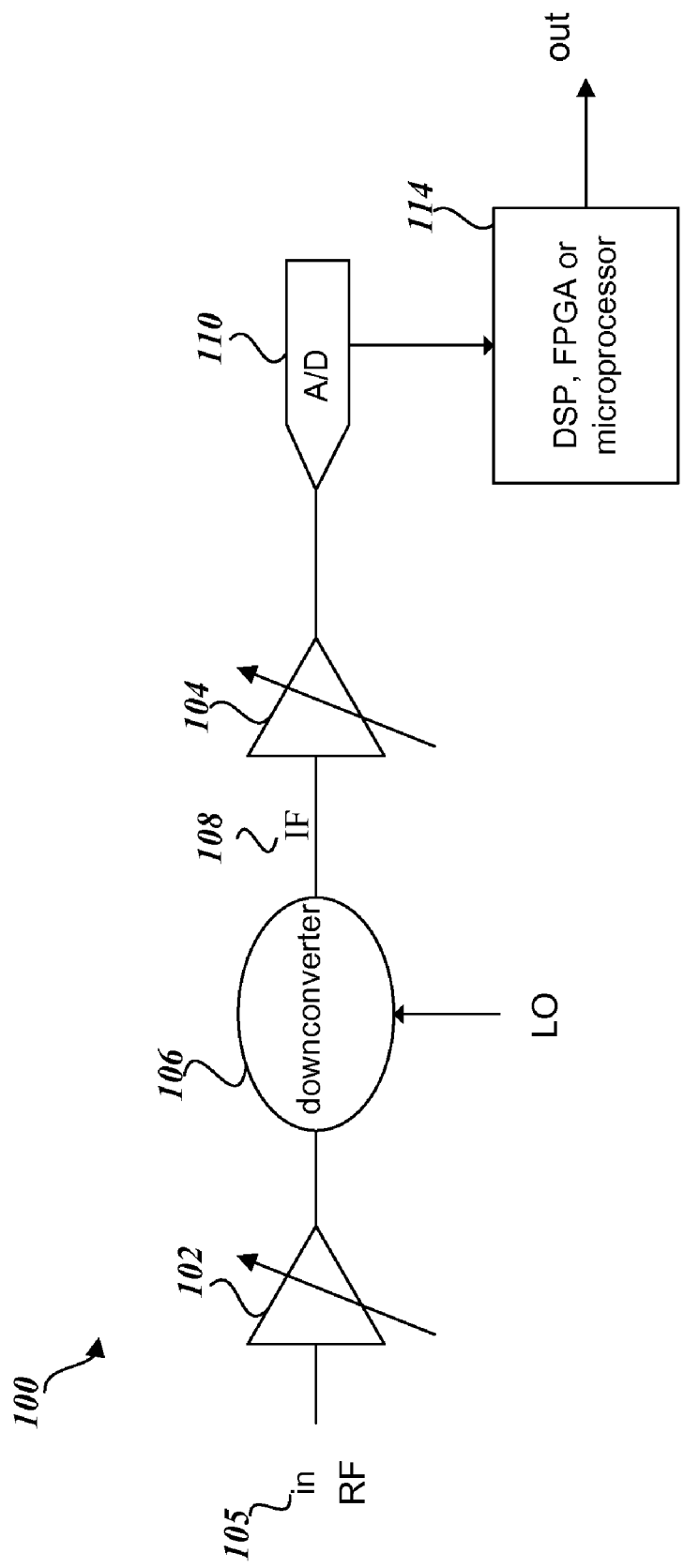
FIG. 1 illustrates a traditional system for making gain changing decisions in a high speed receiver environment using analog hardware.
Figure 2:
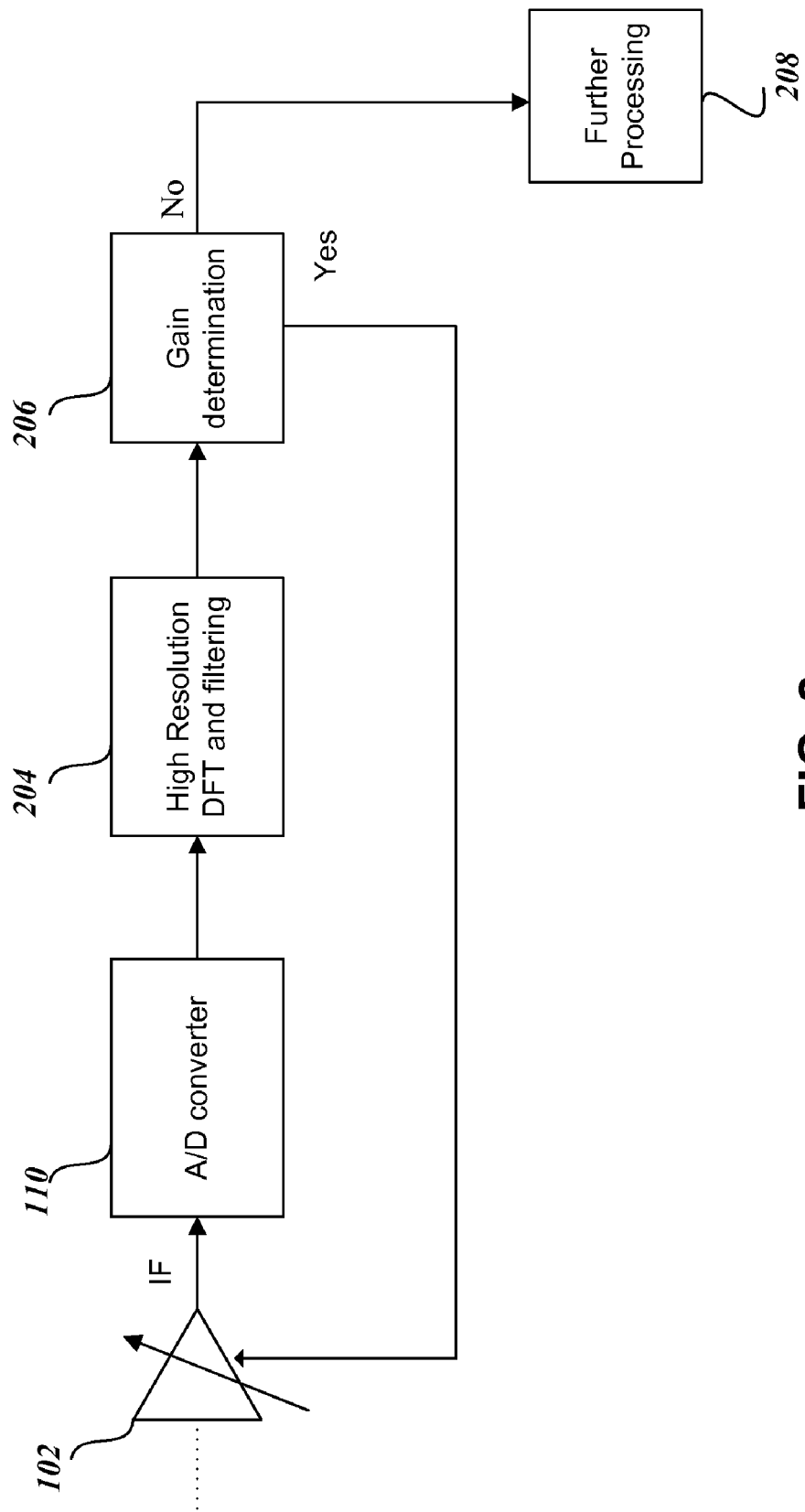
FIG. 2 illustrates a different traditional system for making gain changing decisions in a high speed receiver environment by examining the signal within the processor after the A/D converter.
Figure 3:
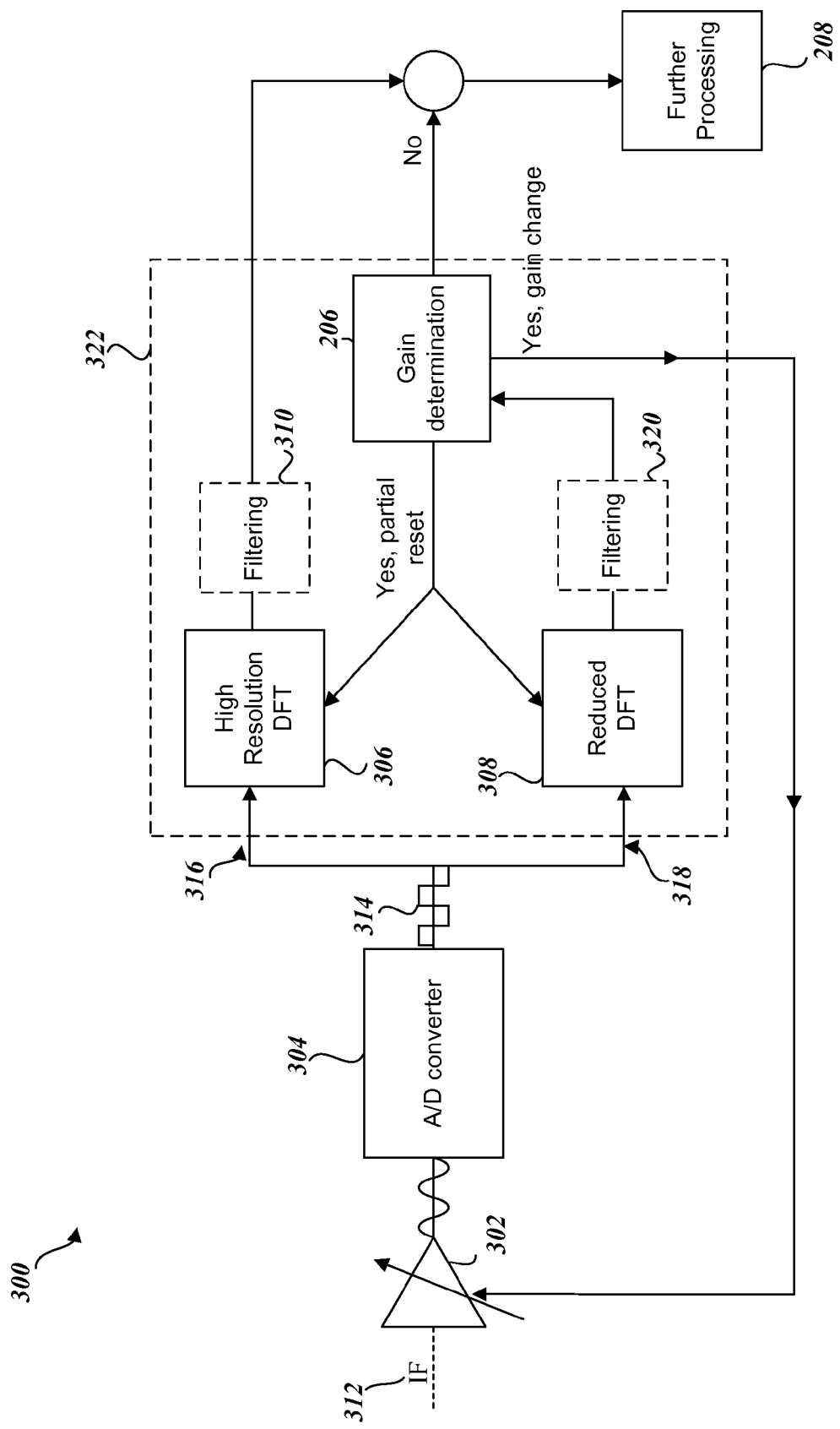
FIG. 3 illustrates components of a receiver system for determining gain change decisions in a high speed receiver environment in accordance with embodiments of the present invention.

FIG. 3 illustrates components of a receiver system 300 for determining gain ranging decisions in a high speed receiver environment according to embodiments of the present invention. The receiver 300 includes a variable gain amplifier 302. The variable gain amplifier 302 can, e.g., receive the intermediate frequency (IF) output 312 from a downconverter (not shown) of a receiver that has a variable gain input (the output from the downconverter is similar to the IF signal 108 of FIG. 1). The variable gain amplifier being controlled can also be a RF variable gain amp or it can represent multiple variable gain stages.

The variable gain amplifier 302 adjusts the gain of IF signal 312 based on a desired signal input to analog-to-digital (A/D) converter 304 and provides the gain adjusted IF signal to the A/D converter 304. If the variable gain is set too low, then the receiver will have sub-optimal dynamic range and signal-to-noise ratios can be a problem. If the variable gain is set too high, there may be compression of the amplifiers or the A/D converter and signal distortion would result.

The A/D converter 304 provides a digital signal output 314 to a processing device 322 (illustrated by blocks 306, 308, 310, 320 and 206). The processing device 322 samples the digital signal output 314 in parallel, both in a first processing path 316 using a high resolution Digital Fourier Transform (DFT) 306, and in a second processing path 318 using a reduced DFT 308.

The reduced DFT 308 requires fewer samples than the high resolution DFT 306. As a result of the fewer samples for the reduced DFT 308, the amount of time to complete a gain ranging decision in the second processing path 318 can be completed in less time than the gain ranging decision made in the first processing path 316.

The reduced DFT block 308, in conjunction with gain determination block 206, processes an initial sample of the digital signal 314 by comparing a Fourier transform of the initial sample of the digital signal 314 with predetermined threshold values. The transform applied to the initial sample provides one or more spectral components that is/are compared with a look-up table of the threshold values in the gain determination block 206. The numerical precision of the reduced DFT 308 can be set to a predetermined value that provides a desired gain ranging resolution with minimal processing time. For example, if the thresholds are based on linear signal levels of 1, 2 and 3, then the effective precision of the DFT should be better than approximately 0.25 (and preferably smaller) to allow a practical separation of the desired signal level regions. In an embodiment, the gain ranging thresholds are determined largely based on parameters of the analog hardware of the receiver in terms of the hardware's noise floor, gain and linearity.

The gain determination block 206 determines, as a result of the comparison of the DFT of the initial sample of the digital signal 314 with the predetermined threshold values, whether a requirement exists for gain ranging on the initial sample of the digital signal 314. Optionally, the initial sampled data of the digital signal 314 from the second processing path 318 can be filtered prior to determining whether the requirement exists for gain ranging. For example, the first processing path 316 provides that the sampled digital signal 314 can be passed through a first filter 310, and the second processing path 318 further provides that the sampled digital signal 314 can be passed through a second filter 320 having reduced precision relative to the first filter 310.

Since the second processing path 318 can be processed before the first processing path 316 has completed its analysis, the gain of the signal output from amplifier 302 can be adjusted at the variable gain amplifier 302 when the gain determination block 206 indicates that gain ranging is required without requiring the full data set for the high resolution DFT path to be completed.

To enable both the high resolution DFT 306 and the reduced DFT 308 to reset their transform parameters based on the change in gain controlled by gain determination block 206, in addition to providing the gain change feedback to amplifier 302, the gain determination block 206 also provides a partial reset signal. The partial reset signal resets the control state of the high resolution DFT 306 and the reduced DFT 308 to reflect the change in gain. Such a reset is provided because the high resolution DFT 306 and the reduced DFT 308 are dependent on the operating state of the overall measurement, including the signal gain. The gain determination block 206 partial reset signal can further be used to reset buffers in the high resolution DFT 306 and the reduced DFT 308 that store samples of the digital signal 314 for the first processing path 316 and second processing path 318. This will allow the buffers to be filled with properly gain ranged data prior to further processing.

The receiver 300 of FIG. 3 is used to illustrate one example of time savings when making gain ranging decisions in a receiver having a first processing path 316 and a second processing path 318. In one exemplary embodiment, the second processing path 318 has a reduced DFT 308 that requires 10 samples of data which arrive approximately 1 sample every 100 ns allowing a computation time of 1 µs and a decision time of approximately 500 ns. The first processing path 316 then has a high resolution DFT 306 that requires 100 samples of data and a computation time of 3 µs (this is because of the higher resolution of the output of the high resolution DFT 306). If no requirement exists for gain ranging on the signal then the second processing path 318 would take 13 µs while the first processing path 316 would take 13.5 µs to determine whether gain ranging is required. If gain ranging is required (and assuming 1 µs for hardware to settle on a gain change), the second processing path 318 would take 16.5 µs while the first processing path 316 would take 28 µs to determine and adjust gain ranging before further processing.

Figure 4:
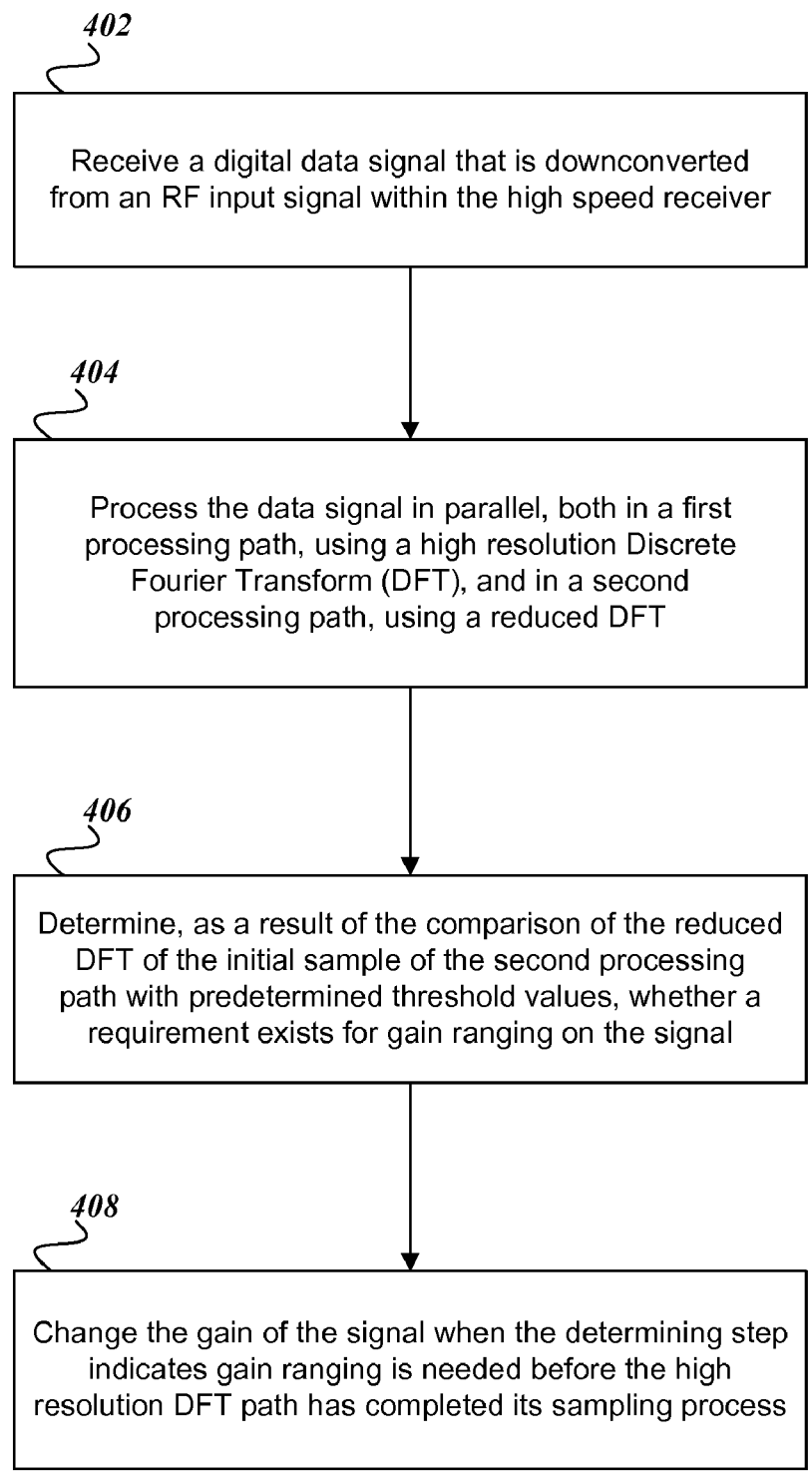
FIG. 4 is a high-level flow diagram that is used to explain gain changing decisions in a high speed receiver environment according to embodiments of the present invention.

FIG. 4 is a high-level flow diagram that is used to explain gain changing decisions in a high speed receiver environment according to embodiments of the present invention. At step 402 a receiver (e.g., receiver 300) receives a digital signal that is downconverted from an RF input signal within the high speed receiver. At step 404, the digital signal is sampled and transmitted in parallel, both in a first processing path using a high resolution DFT, and in a second processing path using a reduced DFT. As with respect to FIG. 3, the reduced DFT has a lower sampling rate than the high resolution DFT. At step 406 a gain determination block (gain determination block 206 of FIG. 3) determines as a result of the comparison of the Fourier transform of the initial sample of the second processing path 318 with the predetermined threshold values whether a requirement exists for gain ranging on the signal. Finally in step 408, if gain ranging is required in the determining step 406, the appropriate gain ranging is applied.

Figure 5:
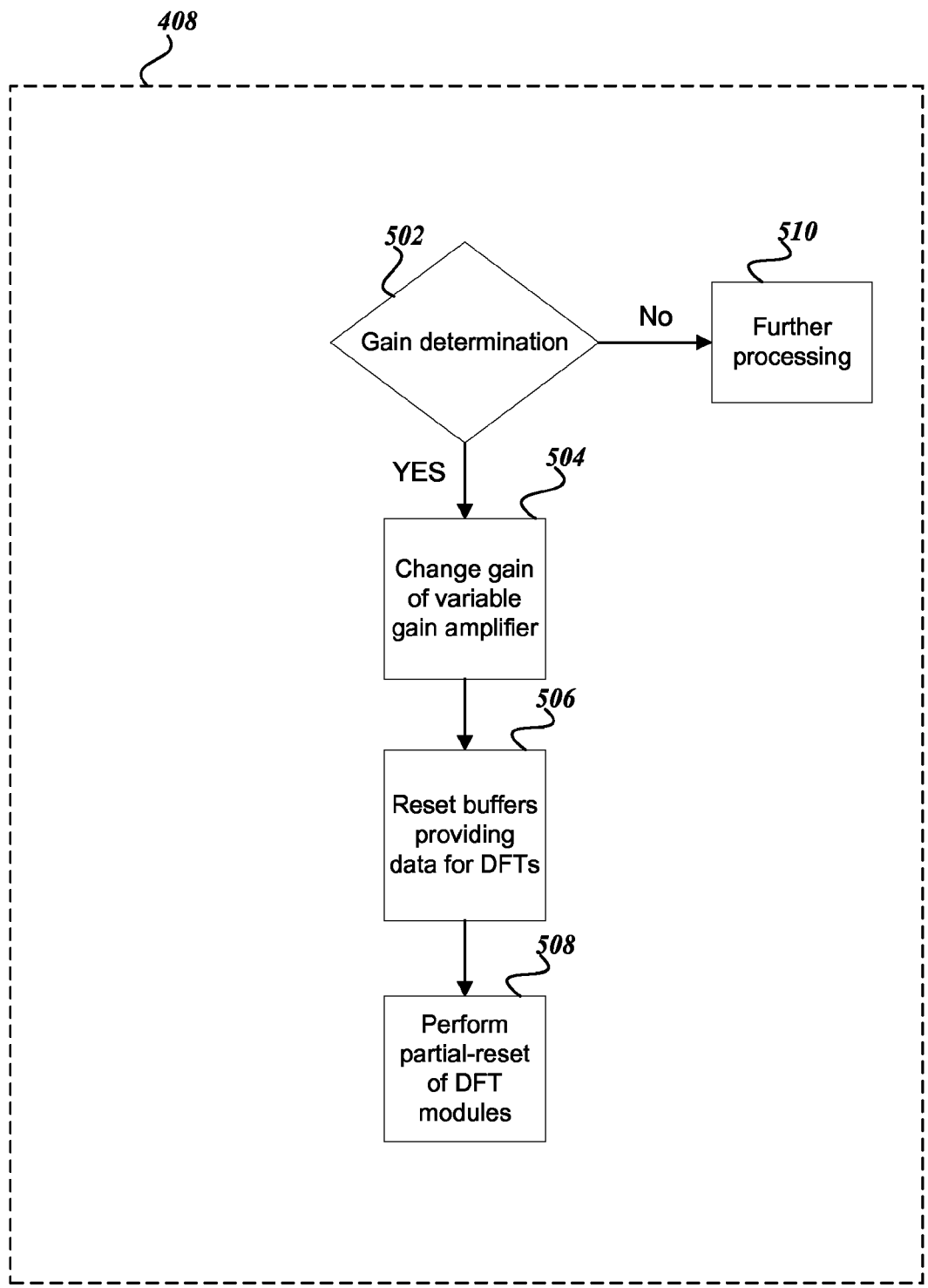
FIG. 5 is a flow diagram used to provide details of step 408 of the flow diagram of FIG. 4

FIG. 5 is a flow diagram that is used to explain further details of step 408 of the flow diagram of FIG. 4. At step 502, the determination of whether gain ranging is required is preformed. This can be accomplished by comparing a Fourier transform of the initial sample of a digital signal (e.g., digital signal 314) with predetermined threshold values. As a result of the comparison of the Fourier transform of the initial sample of the digital signal with the predetermined threshold values, a determination of whether a requirement exists for gain ranging on the initial sample of the digital can be made. If it is determined at step 502 that the gain of the signal requires adjustment, the gain is adjusted at step 504, the buffer is reset at step 506, and a partial re-set signal is sent to the DFTs at step 508.

Resetting the buffers of the processing device that perform the DFTs includes clearing current samples of the digital data signal subsequent to accepting future digital data samples. The partial reset resets a control state of a module performing the DFT or other time-frequency transform by informing the module that that the gain has been adjusted, what the adjusted gain is, and that future digital data samples can be accepted.

If it is determined at step 502 that the gain of the signal does not require adjustment, the signal processed in the first processing path is then acceptable for further process by the receiver system.

The present invention has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the claimed invention. For example, it would be possible to combine or separate some of the steps shown in FIG. 4 without substantially changing the overall events and results.

What is claimed is:

1. A method for making gain change decisions in a high speed receiver environment, comprising the steps of:
receiving a digital data signal at the high speed receiver that is downconverted from an analog input signal;
processing the digital data signal in parallel, both
in a first processing path, using a high resolution time-frequency transform to process a first sample set of the digital data signal, and
in a second processing path, using a reduced time-frequency transform to process a second sample set, wherein the second sample set includes fewer samples than the first sample set;
processing the second sample set of the digital data signal using the second processing path with the reduced time-frequency transform by comparing a frequency-domain representation of the second sample set with predetermined threshold values;

determining, as a result of the comparison of the frequency-domain representation of the second sample set with the predetermined threshold values, whether a requirement exists for gain ranging on the digital data signal, and changing the gain of the analog input signal when the determining step indicates gain ranging is needed before the first processing path has completed its sampling process.

2. The method of claim 1, wherein the second sample set is provided at a particular frequency, and the time-frequency transform applied to the second sample set provides a spectral component that is compared with a look-up table of the predetermined threshold values in the processing step.

3. The method of claim 2, wherein the reduced time-frequency transform has a sample size set such that a minimum number of samples provided will resolve the spectral component within a predetermined uncertainty.

4. The method of claim 1, wherein a numerical precision of the reduced time-frequency transform is set to a predetermined value to provide a desired gain ranging resolution.

5. The method of claim 1, wherein the step of changing the gain further resets buffers for storing samples of the digital data signal subsequent to when the determining step indicates gain ranging is needed.

6. The method of claim 1, wherein the first processing path further provides the digital data signal through a first filter, and the second processing path further provides the digital data signal through a second filter having reduced precision relative to the first filter.

7. The method of claim 1, wherein the time-frequency transform is a Discrete Fourier Transform (DFT).

8. The method of claim 1, wherein changing the gain of the digital data signal further includes a partial-reset signal that resets a control state of a module performing the time-frequency transform.

9. A receiver circuit for making gain change decisions comprising:

a variable gain amplifier receiving a output from a down-conversion in the receiver circuit having a variable gain input, and providing an output;

an analog-to-digital (A/D) convertor that receives the output of the variable gain amplifier and provides a digital data signal;

a processing device that receives the digital data signal output of the A/D converter and:

samples the digital data signal in parallel both in a first processing path, using a high resolution time-frequency transform to process a first sample set of the digital data signal, and in a second processing path, using a reduced time-frequency transform to process a second sample set, wherein the second sample set includes fewer samples than the first sample set;

processes the second sample set of the digital data signal using the second processing path with the reduced time-frequency transform by comparing a frequency-domain representation of the second sample set with predetermined threshold values;

determines, as a result of the comparison of the frequency-domain representation of the second sample set with the predetermined threshold values, whether a requirement exists for gain ranging on the digital data signal, and provides a signal to the variable gain input of the variable gain amplifier to change the gain of the analog input signal when the determining step indicates gain ranging is needed before the first processing path has completed its sampling process.

10. The receiver circuit of claim 9, wherein the processing device comprises at least one of a Digital Signal Processor (DSP), a Field Programmable Gate Array (FPGA), and a Microprocessor.

11. The receiver circuit of claim 9, wherein the time-frequency transform is a Discrete Fourier Transform (DFT).

12. The receiver circuit of claim 9, wherein the first path includes a first filter receiving an output of the high resolution time-frequency transform, and wherein the second path includes a second filter receiving an output of the reduced time-frequency transform, wherein the second filter has a reduced precision relative to the first filter.

13. The receiver circuit of claim 9, wherein when a signal is provided to change the gain of the variable gain amplifier, the processing device provides a partial reset of the high resolution time-frequency transform process and the reduced time-frequency transform process.

\* \* \* \* \*